(12) United States Patent
White

(10) Patent No.: US 6,445,196 B1
(45) Date of Patent: Sep. 3, 2002

(54) TRANSFORMER TEST CONTROL DEVICE

(76) Inventor: Xenia Burdette White, 4628 W. Cumberland Ave., Middlesboro, KY (US) 40965

( * ) Notice: Subject to any disclaimer, the term of this patent is extended or adjusted under 35 U.S.C. 154(b) by 18 days.

(21) Appl. No.: 09/669,625

(22) Filed: Sep. 25, 2000

(51) Int. Cl.[7] .............................................. G01R 31/02
(52) U.S. Cl. ...................................... 324/726; 324/546
(58) Field of Search ................................ 324/726, 546, 324/547

(56) References Cited

U.S. PATENT DOCUMENTS

| | | | | |
|---|---|---|---|---|
| 3,742,346 A | * | 6/1973 | Specht | 324/547 |
| 4,241,306 A | * | 12/1980 | Bump | 324/726 |
| 4,739,248 A | | 4/1988 | Perkins | 324/55 |
| 4,758,774 A | | 7/1988 | Crawford et al. | 324/55 |
| 4,857,827 A | | 8/1989 | Zoltan | 324/55 |
| 4,857,856 A | | 8/1989 | Coleman et al. | 324/547 |
| 4,990,860 A | * | 2/1991 | Peterson | 324/726 |
| 5,172,067 A | * | 12/1992 | Hoffmann | 324/713 |
| 5,276,402 A | | 1/1994 | Schucht | 324/726 |
| 5,396,172 A | | 3/1995 | Lat et al. | 324/547 |
| 5,455,506 A | | 10/1995 | Mimeault et al. | 324/547 |
| 5,479,315 A | | 12/1995 | Schweitzer, III | 361/62 |

* cited by examiner

*Primary Examiner*—N. Le
*Assistant Examiner*—Vincent Q. Nguyen
(74) *Attorney, Agent, or Firm*—Laurence R. Letson

(57) ABSTRACT

This transformer test control device permits testing of an electrical transformer as installed on a power pole without connecting any high voltage of the power distribution line to the transformer, thereby significantly enhancing the safety of the lineman during the testing procedure. A test control device for controlling the testing of an electrical transformer combines a visual indicator acting as both a power-on indicator and a fuse tester, a voltmeter, a voltage adjustment control, an operator control switch and a fuse as well as terminals for connecting both to an alternating current electrical supply and to the terminals of the primary coil of a transformer to be tested. Additionally, the test control device includes terminals for connecting the device and a secondary circuit to selected output terminals of the secondary coil of the transformer and additional terminals for receiving and retaining the contact portions of voltmeter test probes. The test control device simplifies the transformer testing and aids the lineman in testing while maintaining high standards for safety practices and, especially, during adverse weather conditions. This device may be embodied to include a dedicated second voltmeter. The test control device may be powered by either normal 120 volt line voltage or the output of a power inverter connected to the electrical system of a truck or other motor vehicle in those areas without readily available 120 volt AC power.

12 Claims, 5 Drawing Sheets

TRANSFORMER TEST CONTROL DEVICE

FIELD OF THE INVENTION

This invention relates to apparatus for testing electrical transformers and, more specifically, to testing electrical transformers in a manner and at voltages to enhance the safety of the personnel working with such equipment.

BACKGROUND OF THE INVENTION

Transformers are installed by an electric utility provider at various intervals along electrical distribution power lines and, especially, at points at which electrical voltage is reduced further from transmission line voltage to consumer line voltage. An electrical utility power provider installs transformers. From time to time, these transformers may be damaged by natural forces such as lightning strikes or wind damage, animals or birds, and human factors including vehicles knocking down power lines, any of which can lead to short circuits or overheating.

Once a transformer in an electrical power distribution system is damaged and fails, the customers "downline" therefrom are deprived of electrical power and service.

Any power outage may be caused by one or more of a variety of factors: shorts or downed lines which cause fuses to burn out and interrupt power; a broken line; a transformer which develops an open circuit in a winding; a transformer developing an internal short; and other causes. Note, not all of the above causes of power interruption result in a defective transformer.

Whenever a power outage occurs, at least one electrical lineman must go to the cause to determine how best to make repairs. Before a transformer is returned to service, it is desirable that the electrical properties of the transformer be verified.

The verification of the electrical properties typically is done with a voltmeter and a multimeter. A voltmeter is connected to a pair of high voltage terminals on the transformer, and a multimeter or second voltmeter is connected between low voltage terminals. Next, a voltage is applied to the high voltage terminals. In many instances, voltage so applied is supplied by the electrical power grid. This may mean that a very high voltage may be impressed on the potentially defective transformer. To provide such voltage to the high voltage terminals of the transformer, a fuse is inserted in the fuse holder typically associated with the transformer and the fuse holder is closed to complete the circuit. Re-powering the transformer with a high voltage may cause the transformer to burn and/or explode, potentially endangering the safety or life of the lineman. Thus, safety considerations require that a lineman must move away from the transformer prior to re-powering to protect himself.

For overall safety of the lineman, it is preferable to use a separate lower voltage, alternating current power source which is safer and not likely to cause fire or explosions of transformers. However, a line truck may not have such a lower alternating current voltage source available.

The lineman's safety and ability to perform his job are affected or complicated by adverse weather conditions including high wind and rain during the reconnection to the power grid voltage to the transformer, and reading the output terminal voltages, and the safety measures required when working around such high voltages.

With the connection of the power grid voltage to the transformer H1 and H2 voltage terminals, it is also possible that a defective transformer may explode or catch fire, burning or injuring the lineman, or the cooling oil contained within the case of the transformer may spill and may contaminate both the work site and equipment. The typical transformer oil is a hazardous material, requiring an environmental cleanup of polluting cooling oil.

Of course, the transformer may be routinely removed from the pole and replaced with a known non-defective transformer. The expense of such a procedure is quite high and this approach creates a large demand for manpower and an equipment burden, particularly so if the work must be performed under adverse weather conditions. Also, this alternative procedure may result in replacing usable transformers and needlessly spending the cost of an unnecessary replacement.

OBJECTS OF THE INVENTION

It is an object of the invention to provide improved testing equipment for safe and efficient testing of power pole mounted transformers prior to their removal and/or replacement.

It is another object of the invention to reduce the number of pieces of equipment needed for on-site testing of transformers.

It is an additional object of the invention to reduce the exposure to power grid voltages by line personnel.

It is still another object of the invention to simplify the on-site testing of transformers.

The foregoing objects are not intended to limit the scope of the invention in any manner and should not be interpreted as doing so.

With a full and complete understanding of the invention, other objects of the invention will become apparent to one of skill in the art of electrical connections and devices for accomplishing disconnection of electrical connectors.

SUMMARY OF THE INVENTION

A single tester control assembly incorporates into the present invention a plurality of connections and controls to simplify the testing of transformers. This single tester control assembly provides power supply terminals for the attachment of power supply leads to the high voltage terminals of the transformer, conventionally labeled H1 and H2. Bridging the similarly designated and corresponding H1 and H2 power supply terminals is a variable resistor, interior to the tester control assembly. A variable resistor may be operator controlled within a finite predetermined range in order to vary the voltage applied to transformer terminals of H1 and H2.

The variable resistor and the H1 power supply terminal are separated by an operator controllable switch, preferably of the momentary rocker type. This switch will permit the input of alternating current potential to the primary coil of the transformer only after the entire test setup is completed and the operator no longer is touching anything, thus avoiding possible shock to the operator as the test voltage is applied. The conductors to the H1 and H2 terminals of the control assembly may be further bridged, downline from the variable resistor bridge, by a indicator visible to the operator showing if any electrical power is being supplied to the test assembly. Alternatively, a visual indicator may be placed in the high voltage line either immediately prior to the H1 control assembly terminal or between the variable resistor tap and the H1 control assembly terminal connection. Moreover, a visual indicator is connected inline with a fuse socket or holder that also can be used as a fuse tester. The fuse socket may be in addition to a fuse socket in a high voltage conductor and so is disposed for safety purposes.

Also bridging the leads to the terminals of the test control assembly variable resistor is a voltmeter. The voltmeter measures the output voltage from the variable resistor and the test voltage impressed on the terminals H1 and H2 of the transformer. Hence, the test voltage is adjustable and controllable, and the meter provides visual invitation of the test voltage output from the test assembly terminals to the H1 and H2 terminals of the transformer.

The input to the electrical network described above is provided through a ground fault circuit interrupter (GFCI). The GFCI is connected to a male three-prong 120 volt AC connector which protrudes from the body of the test control assembly. Input AC voltage may be applied through an extension cord connected to a power source and connected to the test control assembly.

For ease in using a voltmeter in the adverse conditions frequently encountered by a lineman to repair power lines and the like, a pair of terminals is provided to receive the test leads for connection to the output terminals: X1 and X2; X1 and X3; or X2 and X3 of the transformer. A multimeter preferably is used to accurately read the output voltages from the secondary coil of the transformer. So that the hands of the operator are freed from holding a multimeter or the multimeter test probes against the X1, X2 and/or X3 terminals the multimeter leads are connected into multimeter connecting terminals on the test control assembly. Such lead connection also permits the operator to activate the test switch. Multimeter test leads are clipped to the selected transformer terminals. The pair of terminals provided to receive the multimeter test leads from the secondary coil connections of the transformer are connected directly to the multimeter connecting terminals on the test control assembly. This facilitates the use of a multimeter and typically is found on a utility line truck.

The test control assembly may incorporate, if desired, a dedicated multimeter hard-wired to the X1, X2 connectors or terminals of the test control assembly. Because all utility line trucks commonly carry a multimeter in their complement of tools and equipment, incorporating a dedicated multimeter into the test control assembly unreasonably may increase the cost although the option to incorporate one remains.

The input power to the test control assembly may be supplied from a 120 volt electrical wall outlet or from an inverter power supply connected to and powered from a power point on a line truck.

Inverter power supplies are conventional and readily available, using the battery power of the vehicle to produce an alternating current output once connected to a power point or lighter socket on a vehicle.

Supplying electrical power to the test control assembly through an electrical extension cord permits the testing of the transformer either on the electrical utility power pole or in the shop or equipment yard without having to remove the transformer from the pole or move the transformer to a dedicated test station.

This summary of the invention is not intended to limit the invention in any manner A more detailed and complete understanding of the invention may be secured from the attached drawings and the Detailed Description of the Invention that follows.

DETAILED DESCRIPTION OF THE PREFERRED EMBODIMENT

OF THE BEST MODE FOR CARRYING OUT THE INVENTION

AS CONTEMPLATED BY THE INVENTOR

Figure 1:
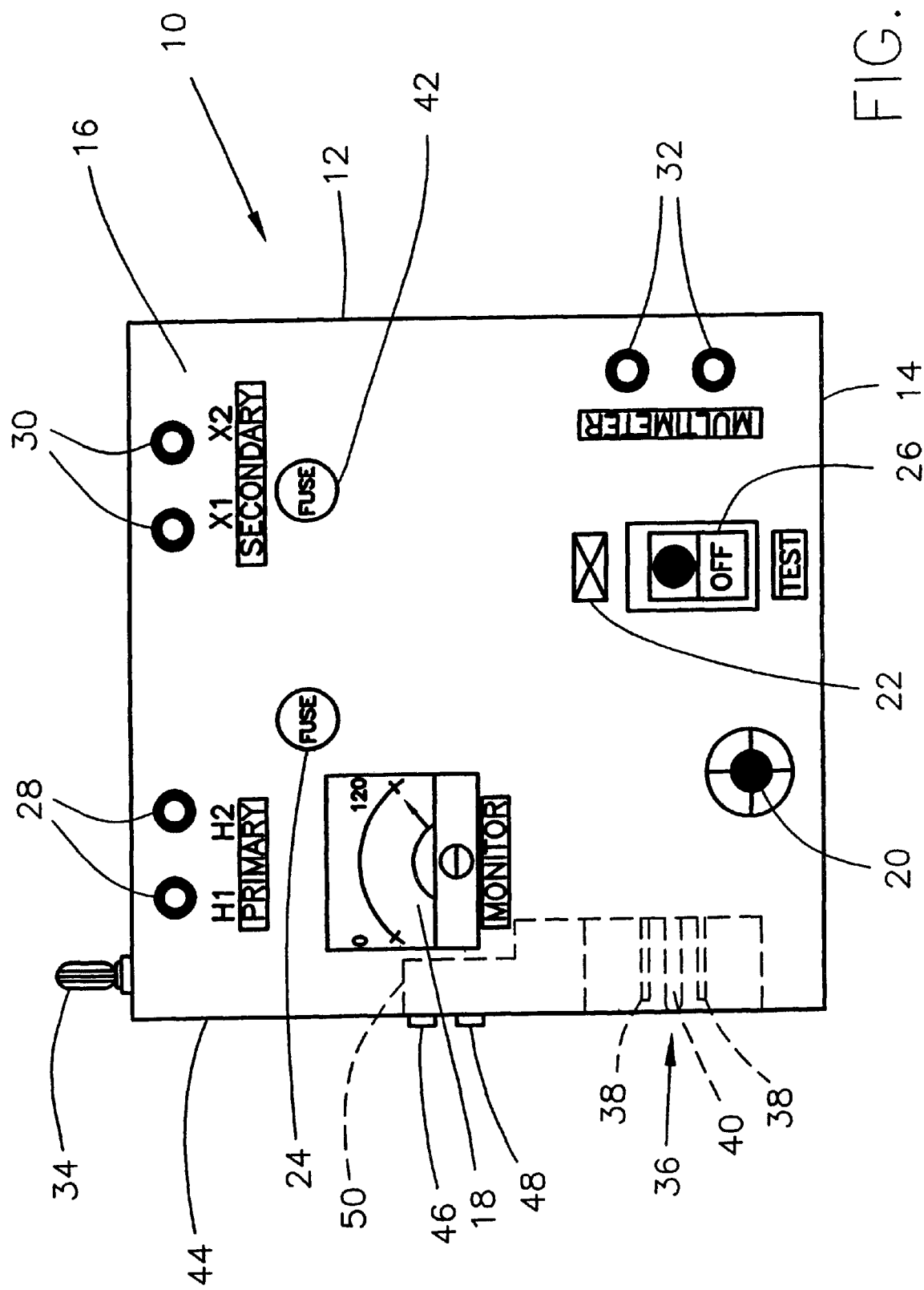
FIG. 1 is a perspective view of the test control assembly housing of the invention.

The invention is a test control assembly 10 for testing electrical power distribution transformers of the type used to reduce or step down the power grid transmission voltage to a voltage usable by a residence or business consumer and commonly referred to as house voltage, i.e., 7200 volts or 2400 volts reduced to 120 volts and 240 volts, 277 volts or 480 volts, respectively. The stepped down or reduced output voltages are determined by the ratio of the number of turns of wire in the primary coil to the number of turns of wire in the secondary coils of the transformer.

The test control assembly typically is contained within a housing or box 12. The housing 12 encloses the circuitry illustrated in and described later with respect to FIG. 2.

The housing 12 is a box advantageously made of an insulating material such as a high dielectric plastic. Disposed on one of the largest sides 16 of the box 12, is a voltmeter 18 of conventional design and having a preferred range including 0–125 volts. A manual control knob 20 is positioned conveniently proximate to a voltmeter 18. The control knob 20 controls a variable resistor bridge 72 to be described later. The face 16 further supports and exposes a visual neon indicator light 22, a fuse socket 24 and a rocker switch 26 of the momentary type, along with a second fuse socket 42. On box 12 and preferably disposed on but not required to be so sited, are three pairs of terminals 28, 30, 32.

Figure 2:
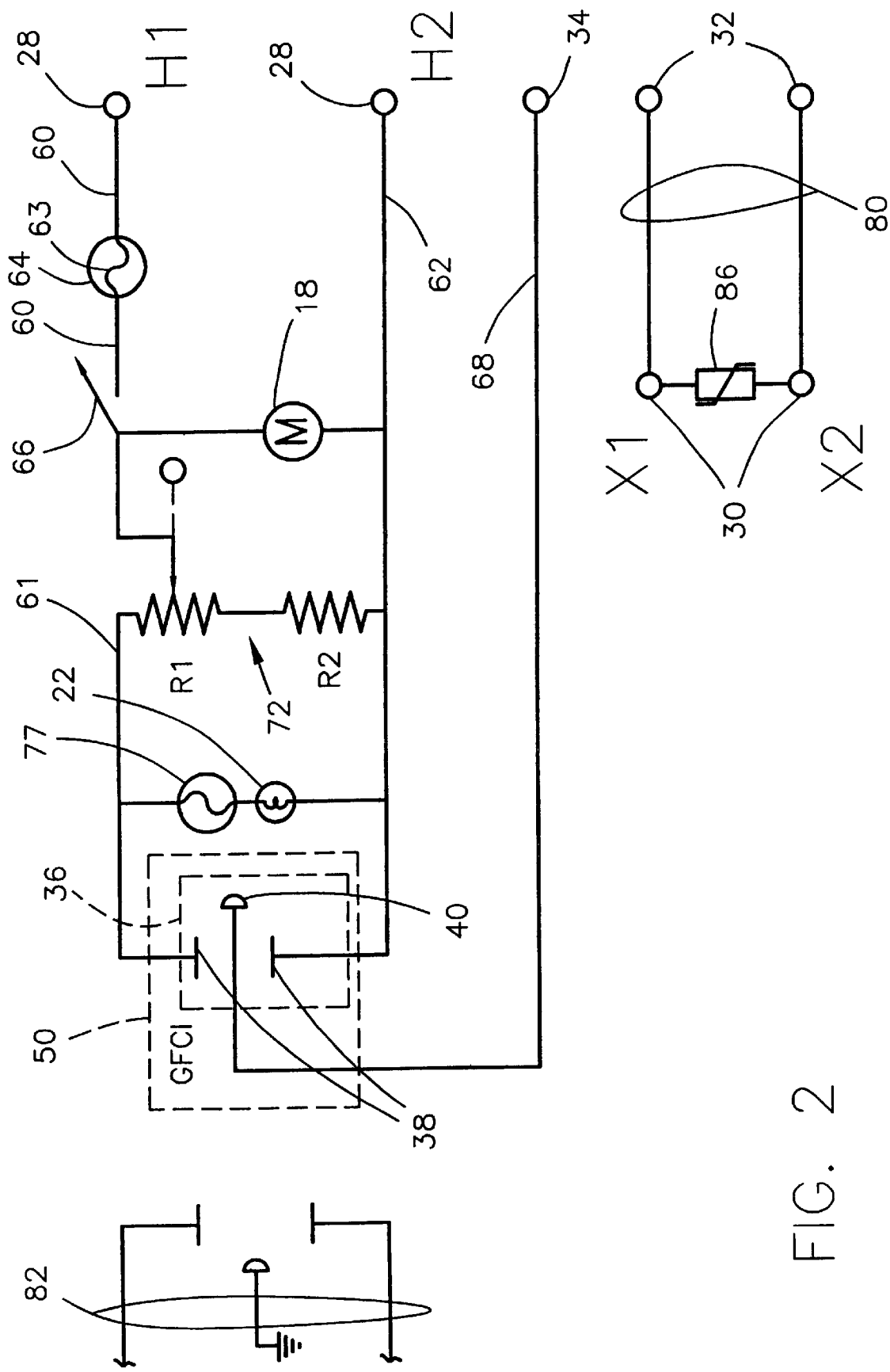
FIG. 2 is a circuit diagram of the test control assembly circuit of the invention.

Referring to FIG. 2, high voltage supply terminals 28, designated H1 and H2 consistent with transformer labeling practices, are each connected to conductors 60 and 62, respectively. Conductor 68 is interrupted by a fuse holder 64 and a test switch 66 and is further connected to the high side of the connector 36. Conductor 62 is connected to the common side of connector 36.

Further, single terminal 34, a ground terminal of test control assembly 10, is disposed and mounted on housing or box 12. Also disposed within a recess 37 in a wall 14 of box 12 is a conventional male connector 36 comprising a pair of blade prongs 38 for insertion into a conventional female connector on extension cord 116 (FIG. 5) and a single ground post 40 for insertion into a female ground connector 82 (FIG. 5) to electrically connect with a ground conductor of a three-wire extension cord such as cord 116 shown in FIG. 5. The housing 12 has mounted thereon a terminal 34 for connection of a lead to a ground lug on the transformer case 102 as will be described below with reference to FIG. 5. The side panel 44 of box 12 further supports the TEST button 46 and a RESET button 48 of GFCI module 50. The connection of the various elements and terminals will be described more fully below.

Conductor 68 is connected to the ground terminal 40 of connector 36 and to ground terminal 34 of test control assembly. This connection permits detection of any current flowing through the casing of the transformer 100, shown in FIG. 5, typically due to any internal short between the primary or secondary coil (not shown) and the interior of the casing 102 and disconnect voltage from the high voltage terminals 28 impressed on the H1 and H2 terminals of the transformer 100.

Figure 5:
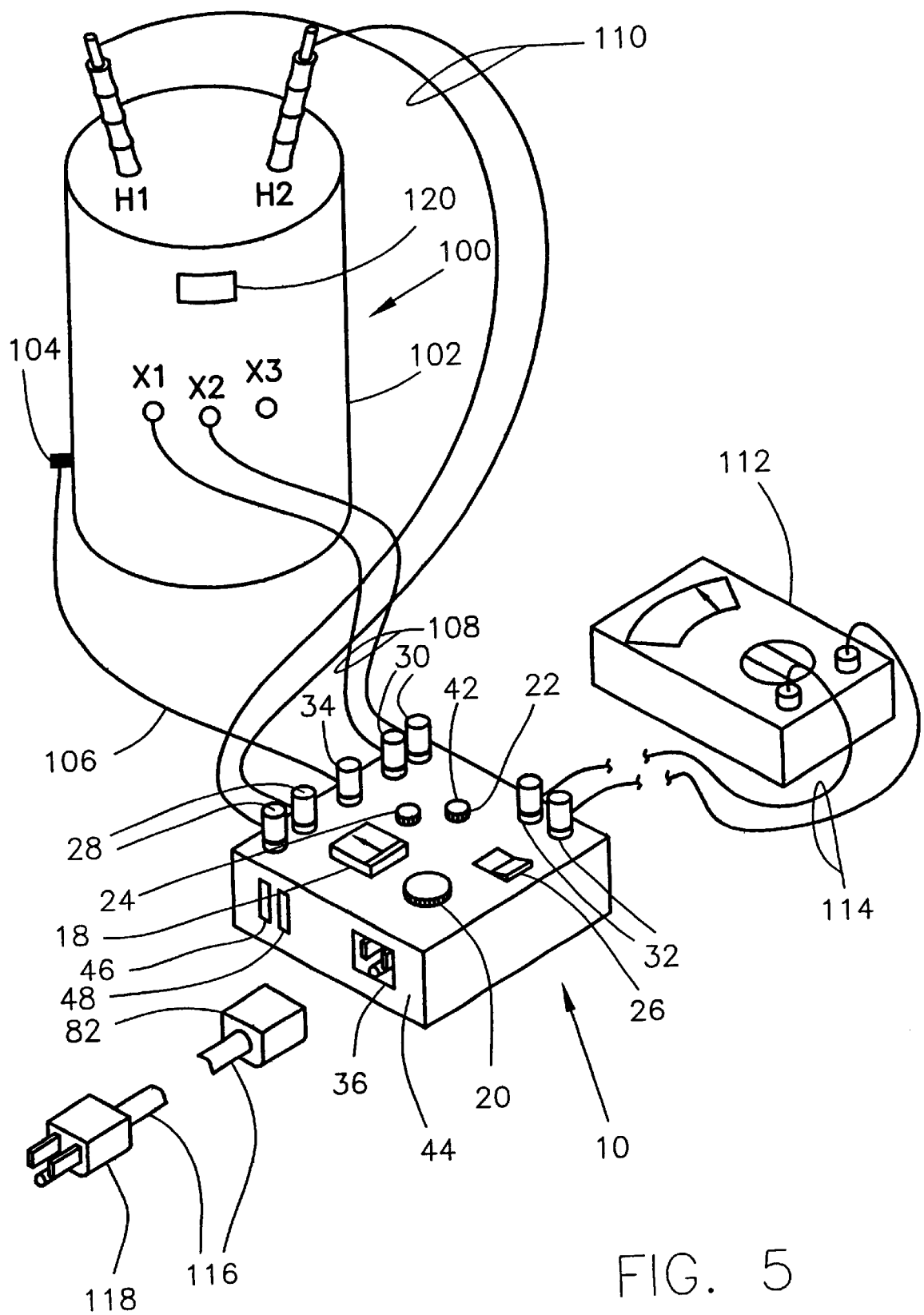
FIG. 5 is a diagram of the test control assembly of the invention connected to a transformer, a power source and a multimeter.

Disconnection occurs by the detection of the electrical current flowing to and through ground terminal 104 of the transformer 100 seen in FIG. 5. Referring again to FIG. 2, the flow of electrical current through ground conductor 68 of the test control assembly 10 will trip the GFCI 50 causing all electrical power supplied through the test control assembly 10 to be interrupted.

Figure 3:
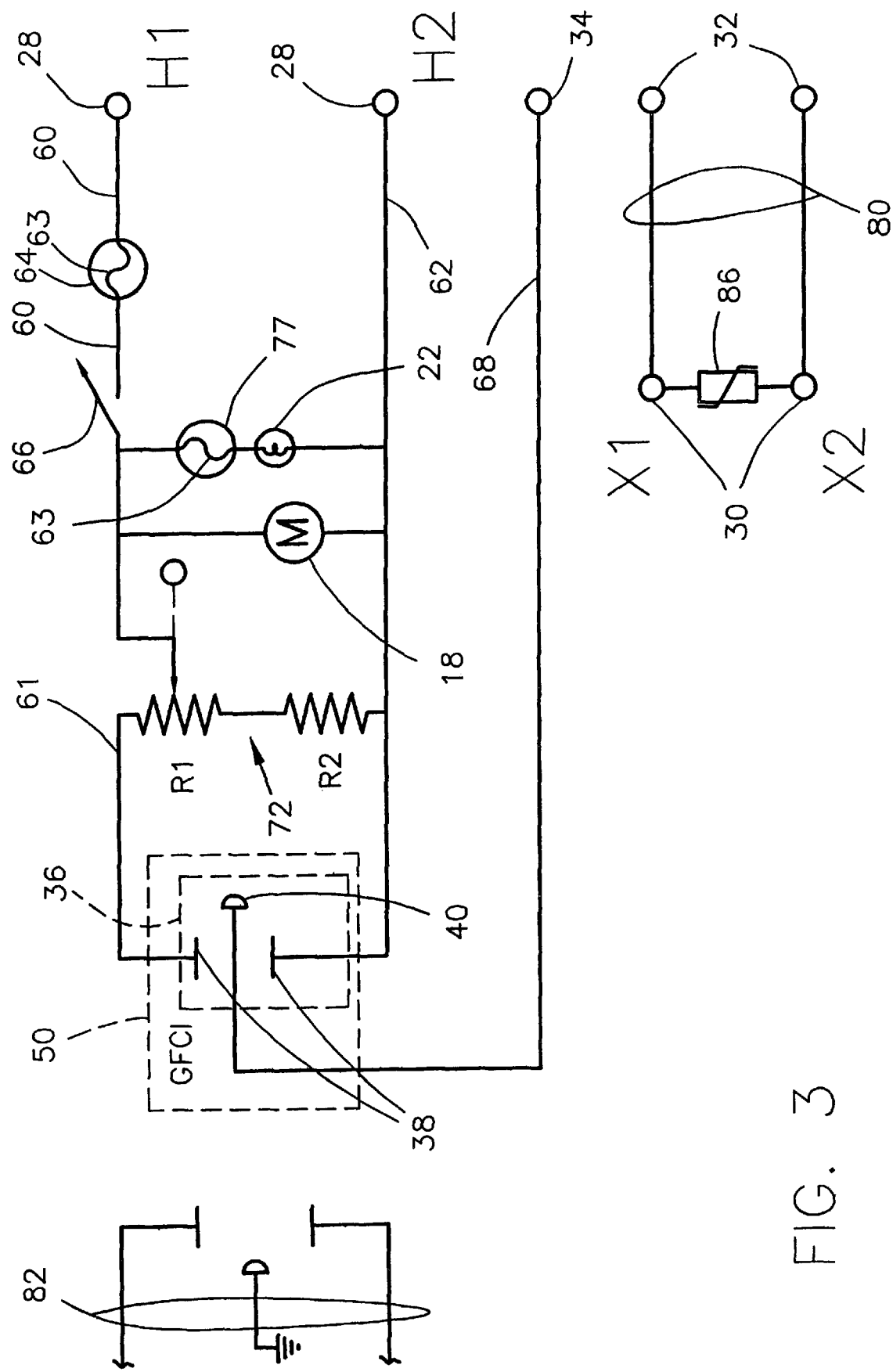
FIG. 3 is an illustration of the circuit diagram of FIG. 2 with the visual indicator relocated to a first alternate location.

As shown in FIG. 3, a resistor bridge 72 and a voltmeter 18 bridge between high side conductor 61 and common conductor 62. Resistor bridge 72 is made of a variable resistor R1 and a fixed resistor R2 connected in series and further connected with the variable resistor R1 connected to the high side input conductor 61. Variable resistor R1 has an adjustable tap 74 which is similarly connected to the high side conductor 60. Tap 74 is controlled by an adjustment knob 20 shown in FIG. 1. Control of the position of tap 74, relative to the resistor windings, controls and adjusts the voltage output therethrough and controls and adjusts the voltage impressed upon terminals 28 of transformer 100 and, hence, across high voltage primary coil terminals H1 and H2, terminals 28 of a transformer 100 to be tested.

Voltmeter 18 is similarly connected to conductors 60, 62, and intermediate resistor bridge 72 and test switch 66. This location of the voltmeter 18 permits determining and adjusting the output voltage prior to connecting any electrical potential to a transformer 100 to be tested.

The lead of visual indicator 22 connected with the high side conductor 61 includes, in series, a second fuse holder or fuse socket 77.

Figure 4:
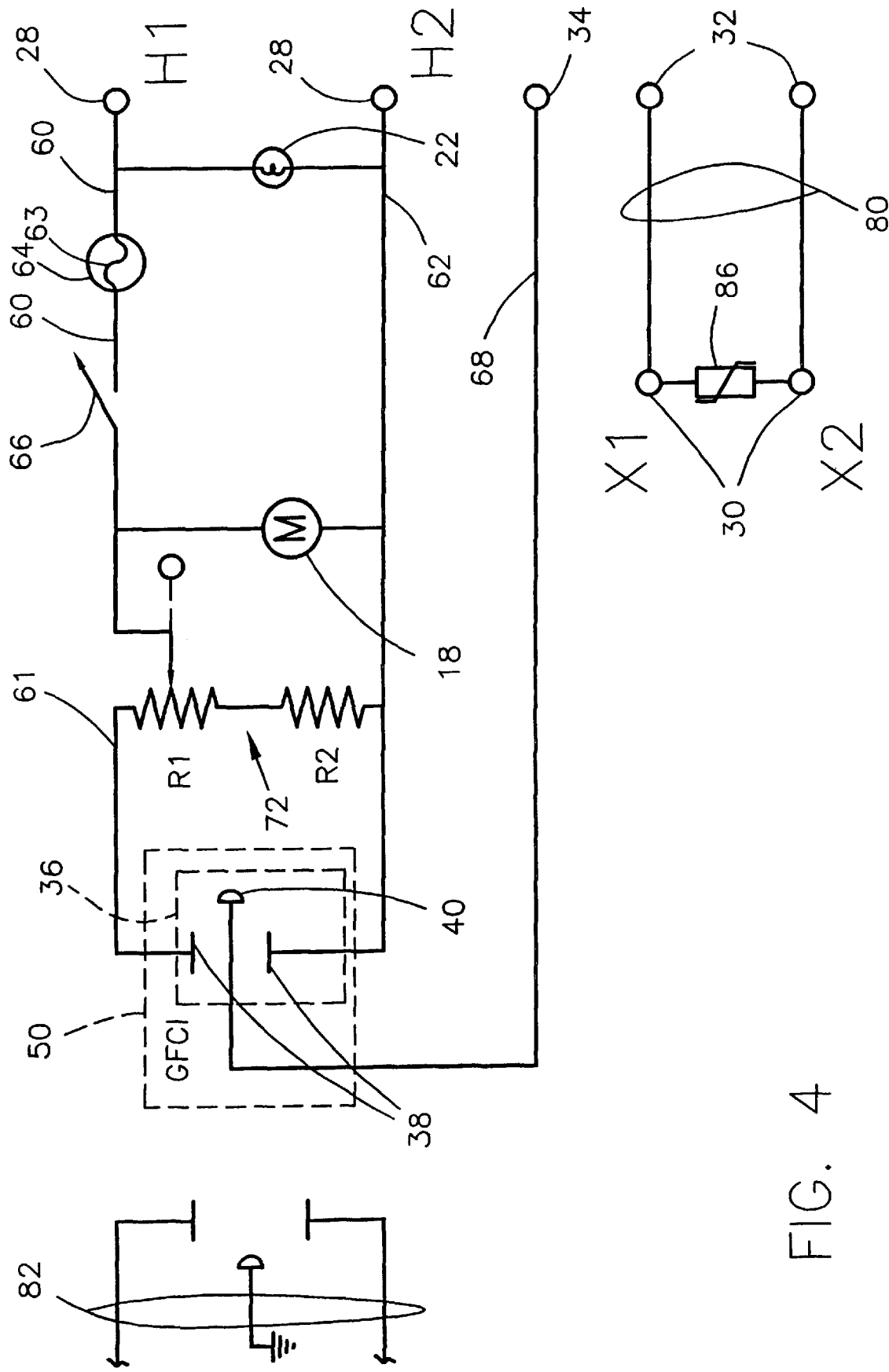
FIG. 4 is an illustration of the circuit diagram of FIG. 2 with the visual indicator relocated to a second alternate location.

With reference to FIG. 4, it can be seen the circuit is very similar to that of FIG. 2, except that the visual neon indicator light 22 has been repositioned to bridge between conductor 60 and common conductor 62, while the second fuse holder 77 has been eliminated. The visual neon indicator light 22, situated between conductors 60 and 62, as shown in FIG. 4, will indicate that the fuse 63 is good when the test switch 66 is closed with electrical power applied to the power input 36.

The internal circuitry of GFCI 50 is not described in detail as such a circuit is conventional, well-known and a GFCI 50 merely forms a component of this invention.

The test control assembly housing 12 is further provided with two additional pairs of terminals 30, 32. Terminal pairs 30 and 32 are interconnected by conductors 80. Terminals 32 preferably are of the type which accept insertion of multimeter test probes (not shown) and can be tightened to retain such inserted test probes.

Illustrated schematically in FIG. 2 is a connector 82 of an electric extension cord. The extension cord connector 82 can be used to connect an alternating current voltage potential to the test control assembly 12, by plugging connector 82 onto the male connector blades 38 and ground pin 40 protruding from recess 37 in FIG. 1.

The potentiometer formed by resistor R1 and tap 74, in conjunction with volt meter 18, is used to adjust the voltage between conductors 60, 62 to one of a plurality of predetermined voltages, such as 120 volts or 94 volts. Other voltages may be used if desired.

The fuse holder 64 is provided with a very small amperage fuse, such as a 63 milliampere rated fuse. This very small capacity fuse 63 provides an extremely sensitive current limiter which will blow or open if a short circuit exists in a transformer 100 being tested.

The GFCI 50 is a back-up protective device which also detects a flow of electrical current from the conductors 60 or 62 to ground 40 and then trips in order to protect the lineman.

Because of the extremely small capacity of a 63 milliampere fuse 63 in fuse holder 64, the fuse 63 is very difficult to visually inspect. In order to provide a tester with a visual indication of the electrical condition of the fuse 63, fuse 63 may be removed from fuse holder 64 and placed in fuse holder 77 as illustrated in FIGS. 2 and 3. If fuse 63 is good, the visual neon indicator light 22 will illuminate, thereby indicating continuity. The fuse 63 then may be placed in fuse holder 77 for the testing of the transformer 100, as in FIG. 2. If the visual indicator 22 is disposed connected to the fuse holder 64 and the H1 terminal 28, the visual indicator 22 will function whenever the test control assembly 10 is activated by depression of TEST switch 66.

Terminals 30, designated X1 and X2 consistent with transformer labeling practices, are connected to test leads 108, shown in FIG. 5, which are further connected to two of the three terminals X1, X2, X3 on a transformer 100 being tested. Terminals 32 are further connected to the test probes 114 of a multimeter 112. Alternatively, the connection to the multimeter 112 may be hard-wired and the housing 12 expanded to include and contain a dedicated multimeter mechanism or a second dedicated variable range voltmeter.

FIG. 5 will be used to explain the testing procedure using the test control assembly 10.

A transformer 100 having a casing 102 is conventionally provided with a pair of primary terminals 28. Additionally, secondary winding terminals X1, X2, X3 are provided on a the transformer 100. The output voltage from the secondary winding terminals X1 and X3 is typically 240 volts with a voltage of 120 volts between terminals X1 and X2 and between terminals X2 and X3, when a primary voltage of the 7200 volts is applied to primary terminals H1 and H2, terminals 28. The transformer 100 is designed to reduce the voltage applied to terminals H1 and H2, terminals 28, by a ratio equal to the ratio of turns in the primary winding to the turns in the secondary winding. The secondary winding connects terminals X1 and X3. Terminal X2 is a center tap to the secondary windings of the transformer.

For example, if the ratio is 60:1, input of 7200 volts will provide 120 volts output as described above or 120 volts between terminals X1 and X2 and 240 volts where a 30:1 ratio is provided for the secondary coil between terminals X1 and X3. Transformers typically are labeled indicating the ratio of the input and output voltages with respect to various pairs of output terminals.

The ground terminal 34 is connected to the ground lug 104 on transformer casing 102 by a lead 106 and the high voltage terminals 28 connected by lead 110. Leads 108 interconnect secondary coil terminals X1 and X2 and terminal pair 30.

Multimeter 112, through test leads 114 is engaged with terminals 32 and through internal wiring (not shown) with terminals 30.

Extension cord 116 is connected with test control assembly 10 at connector 36. The male end 118 of extension cord 116 is connected to any convenient alternating current power source. Such power source may be a wall outlet providing 120 volts in a shop or equipment yard or a power inverter connected to a power point on a line truck. The potentiometer control 20 or manual control knob 20 is manipulated to adjust the output of the potentiometer tap 74 to 120 volts. If 120 volts are not available on the input lines 61, 62, then the output of potentiometer 20 should be adjusted to 94 volts which is a voltage low enough that both utility voltage and the inverter voltage can be adjusted to that potential.

Assuming that the GFCI 50 does not trip, the test switch 66 is closed to impress either 120 volts AC or 94 volts AC on terminals 28 transformer terminals H1, H2, and across the primary coil (not shown) of transformer 100. If fuse 63 is burned or blown resulting from the closure of test switch 66, the transformer 100 is shorted internally and, as discussed before, must be replaced.

If the GFCI 50 trips during this period of adjustment, the transformer 100 is shorted through the case 102 and is deemed to be defective; consequently, no further testing is required as the transformer 100 must be replaced.

Once the test input voltages, 120 volts AC or 94 volts AC, are impressed across the high voltage terminals H1 and H2, terminals 28, the output of the secondary coil (not shown) is determined by reading multimeter 112. The voltage reading from the multimeter or voltmeter 112 is compared with a predetermined voltage range reflecting the step down ratio or step down factor of the transformer 100 from the transformer data plate 120.

Table 1 is an example of such ranges for various primary voltages and secondary voltages for various common transformers and a test voltage of 94 volts AC. The output voltages nominal reading and the upper and lower limits of a tolerance range of +/−0.6% are reflected in the table.

TABLE 1

TRANSFORMER NAMEPLATE DATA AND MULTIMETER READING

| Primary Voltage | Secondary Voltage | Test Voltage | Multimeter Reading | | |
|---|---|---|---|---|---|
| 2400 | 120 | 94 | 4.664 | 4.700 | 4.736 |
| 2400 | 240 | 94 | 9.328 | 9.400 | 9.472 |
| 2400 | 480 | 94 | 18.656 | 18.800 | 18.944 |
| 2400 | 277 | 94 | 10.766 | 10.849 | 10.933 |
| 7200 | 120 | 94 | 1.555 | 1.567 | 1.579 |
| 7200 | 240 | 94 | 3.109 | 3.033 | 3.157 |
| 7200 | 277 | 94 | 3.589 | 3.617 | 3.644 |
| 7200 | 480 | 94 | 6.219 | 6.267 | 6.315 |

Table 2 is a similar example for a test voltage of 120 volts AC.

TABLE 2

TRANSFORMER NAMEPLATE DATA AND MULTIMETER READING

| Primary Voltage | Secondary Voltage | Test Voltage | Multimeter Reading | | |
|---|---|---|---|---|---|
| 2400 | 120 | 120 | 5.964 | 6.000 | 6.036 |
| 2400 | 240 | 120 | 11.928 | 12.000 | 12.072 |
| 2400 | 480 | 120 | 23.856 | 24.000 | 24.144 |
| 2400 | 277 | 120 | 13.767 | 13.850 | 13.934 |
| 7200 | 120 | 120 | 1.988 | 2.000 | 2.012 |
| 7200 | 240 | 120 | 3.976 | 4.000 | 4.024 |
| 7200 | 277 | 120 | 4.589 | 4.617 | 4.645 |
| 7200 | 480 | 120 | 7.952 | 8.000 | 8.048 |

The tests are repeated for connections of leads 108 with terminals X1 and X3 and for terminals X2 and X3. If the voltage reading on the multimeter 112 is outside the acceptable tolerance range or 0 volts for any test step, the windings of the transformer 100 being tested are defective and, therefore, the transformer 100 must be replaced.

At any time, if there is a question regarding the electrical continuity condition of fuse 63, as shown in FIGS. 2 and 3, fuse 63 may be transferred to fuse holder 77 for testing; should the visual neon indicator light 22 not respond and light up, continuity does not exist and fuse 63 must be replaced.

As a further safety feature of the test control device 10, the X1, X2 terminals 30 are bridged by a varistor 86 rated at 30 to 40 volts. The varistor 86 will not conduct until the voltage potential applied across it and terminals 30 exceeds the rated voltage. Then the varistor 86 will break down and conduct creating a short between H1 and H2 terminals 28 on the test control device 10 and short the high side and low side conductors 60, 62 consequently tripping GFCI 50 and/or blowing fuse 63.

This arrangement insures that the inadvertent connection of the H1, H2 terminals 28 to the X1, X2, X3 terminals on the transformer will be defeated; moreover, the test control device 10 will not be subjected to up to 7200 volts when the H1, H2 terminals of the transformer are connected to the X1, X2 terminals 28 of the test control device 10.

The ratios, transformer voltages, test voltages, output voltages and fuse ratings used in the above description of the invention are by way of example only and reflective of the preferred embodiment of the invention. The above discussed values may be altered as desired in accordance with well known principles and will not affect the invention which is defined by the attached claims which defines the invention.

I claim:

1. A transformer control device comprising:
   a voltage measuring device:
   a ground fault circuit interrupter control connected in parallel with said voltage measuring device;
   a pair of input terminals connected to said ground fault circuit interrupter for connecting with a source of alternating current power, said ground fault circuit interrupter further connected to a high side and a common conductor of said transformer test control device;
   a voltage divider network including a potentiometer, said potentiometer and said voltage divider connected in parallel with said voltage measuring device;
   a switch connected to said potentiometer;
   a fuse in series with said switch, and
   a pair of output terminals for connecting alternating current power to terminals on a transformer, one connected through a conductor to said switch and another connected by said common conductor to one of said input terminals.

2. The transformer testing control device of claim 1 further comprising a connection to said ground fault circuit interrupter control, adapted to be connected to ground.

3. The transformer testing control device of claim 2 wherein said testing device further comprises a second pair of terminals connected to a third pair of terminals, one of said second or third pair of terminals forming a connection to a second voltage measuring device.

4. The transformer testing control device of claim 3 wherein said testing device further comprises a visual indicator connected in parallel with said voltage divider network.

5. The transformer testing control device of claim 4 wherein said connection of said visual indicator is disposed between said ground fault circuit interrupter and said voltage divider network.

6. The transformer testing control device of claim 4 wherein the other of said second or third pair of terminals are for connection to secondary output terminals of a transformer to be tested.

7. The transformer testing control device of claim 6 wherein said first pair of input terminals comprise a male three-prong connector for connection to a female electric outlet.

8. The transformer testing control device of claim 6 wherein said male three-prong connector further comprises a ground connector as the third prong.

9. The transformer testing control device of claim 6 wherein said testing control is contained in a single housing.

10. The transformer testing control device of claim 9 wherein said first pair of input terminals and said ground connector are disposed recessed into said housing containing said testing control device.

11. The transformer testing control device of claim 9 wherein said first pair of input terminals and said ground connector are disposed on an end of an electrical cable having at least three conductors and extending from said housing containing said testing control device.

12. The transformer testing control device of claim 9 wherein said pair of output terminals are bridged by a varistor.

* * * * *